United States Patent
Raychaudhuri et al.

(10) Patent No.: US 6,875,320 B2
(45) Date of Patent: Apr. 5, 2005

(54) HIGHLY TRANSPARENT TOP ELECTRODE FOR OLED DEVICE

(75) Inventors: Pranab K. Raychaudhuri, Rochester, NY (US); Joseph K. Madathil, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/429,357

(22) Filed: May 5, 2003

(65) Prior Publication Data

US 2004/0222737 A1 Nov. 11, 2004

(51) Int. Cl.⁷ .......................... C23C 14/34; B05D 5/06; H01J 9/24
(52) U.S. Cl. .................... 204/192.12; 427/66; 427/402; 427/404; 427/419.1; 427/419.2; 445/24
(58) Field of Search ...................... 204/192.12, 192.22; 445/24; 427/66, 402, 404, 419.1, 419.2

(56) References Cited

U.S. PATENT DOCUMENTS

| | | | |
|---|---|---|---|
| 5,550,066 A | 8/1996 | Tang et al. | 437/40 |
| 6,420,031 B1 | 7/2002 | Parthasarathy et al. | 428/411.1 |
| 2003/0129447 A1 * | 7/2003 | Madathil et al. | 428/690 |
| 2003/0224204 A1 * | 12/2003 | Raychaudhuri et al. | 428/690 |

OTHER PUBLICATIONS

Takada et al, Control of emission characteristics in organic thin film electroluminescent diodes using an optical microcavity structure, Appl. Phys. Lett. 63 (15) 2032 (1993).

Liao et al, Ion–beam induced surface damages on tris–(8–hydroxyquinoline) aluminum, Appl. Phys. Lett. 75, 1619 (1999).

* cited by examiner

*Primary Examiner*—Steven Versteeg
(74) *Attorney, Agent, or Firm*—Raymond L. Owens

(57) ABSTRACT

A method of making an OLED device capable of emitting light through the top electrode of such device includes providing a substrate and an anode over the substrate; providing an emissive layer disposed over the anode; providing first and second layers over the emissive layer with the first layer being in contact with the emissive layer or electron-transport layer and having a compound that includes an electron-injecting element, and the second layer having a reactive metal, and wherein such reactive metal reacts with the compound to release the electron-injecting element that dopes the interfacial region of the emissive layer or electron-transport layer to improve electron-injection and also reduces the reflectivity of the first and second layers is reduced; and providing a transparent conducting non-metallic top electrode over the second layer.

28 Claims, 2 Drawing Sheets

HIGHLY TRANSPARENT TOP ELECTRODE FOR OLED DEVICE

FIELD OF THE INVENTION

The present invention relates to OLED devices having a highly transmissive top electrode.

BACKGROUND OF THE INVENTION

Organic electroluminescent displays, commonly called OLED devices for organic light-emitting diode devices, are typically coupled with active matrix (AM) circuitry in order to produce high performance displays. The basic OLED device has in common an anode, a cathode, and an organic electroluminescent medium sandwiched between the anode and the cathode. Such a display is disclosed in U.S. Pat. No. 5,550,066. However, in this bottom-emitting type of display where light is emitted downward through the substrate, the overall area that can emit light is limited by the presence on the substrate of Thin Film Transistors (TFT's) and other circuitry, which are opaque. Consequently the open area available for the light to emerge is reduced. The ratio of open area to that of the entire device area is called the Aperture Ratio (AR). Due to the reduction of the AR the display will run dim. To compensate for the reduced average brightness level, the drive current has to be increased subjecting the display to increased risk of operational degradation. This results in the lower AR devices having a shorter useable life than a device with a higher AR. In top-emitting device structures where the light is made to emerge through top surface away from the substrate and TFT circuitry, the AR is significantly higher than the conventional bottom emitting devices.

Therefore, much work has been done to produce AM devices, which are top- or surface-emitting. This configuration has potential to improve display performance compared with bottom-emitting OLEDs by: 1) increasing the aperture ratio, therefore allowing the pixel to operate at a lower current density with improved stability; 2) allowing more complex drive circuitry to enable better control of pixel current, leading to enhanced display performance (uniformity, stability); 3) enabling lower mobility materials, i.e., amorphous silicon, to be considered for TFT fabrication; and 4) allowing schemes for increasing the emission out coupling (increased efficiency) that are not available for the bottom-emitting format. A design for top-emitting OLEDs utilizes a reflective metallic anode and a semi-reflective metallic cathode as the top electrode. These metallic materials contribute to a microcavity effect within the devices that limits the optical qualities. Highly transparent materials (e.g., indium-tin-oxide (ITO)) are being considered to replace the semi-reflective cathodes; however, known deposition methods for these materials are not compatible with the said structure designs, and these highly transparent materials are less electrically conductive than the semi-reflective materials. The fact that these materials are less electrically conductive makes implementing a highly transparent cathode in a large display difficult because of the greater distance that the current must travel.

In U.S. Pat. No. 6,420,031, assigned to The Trustees of Princeton University, a class of low reflectivity, high transparency, non-metallic cathodes useful for a wide range of electrically active, transparent organic devices is disclosed. The representative embodiment of this invention employs ITO as the electrically conductive non-metallic layer and a phthalocyanine compound such as ZnPc or CuPc as the electron-injecting interface layer. The low-resistance electrical contact is formed only when the ITO is deposited onto the organic layer and not when the organic layer is deposited onto the ITO layer. The CuPc layer functions as: 1) a protection layer, preventing damage to the underlying organic layers during the ITO sputtering process; and 2) an electron-injecting region, functioning in combination with the ITO layer to deliver electrons to the adjacent electron transporting layer. This solution for delivering a highly transparent cathode for use in an OLED is insufficient because it: 1) does not optimize the electron injection into the electron transport layer; and 2) uses materials unsuitable for full color devices.

Destructive light interference can result from microcavity effects within a top-emitting OLED with a reflective cathode and can cause color distortion when the top-emitting OLED is viewed from oblique angles. The emission from microcavity devices is characteristically directional. The emission is shifted to shorter wavelength and the intensity falls rapidly with viewing angle. (See, for example, N. Takada, T. Tsutsui, and S. Saito Appl. Phys. Lett. 63 (15) 2032 (1993) "Control of emission characteristics in organic thin film electroluminescent diodes using an optical microcavity structure".) Additionally, much less light is absorbed in the transparent ITO cathode compared to the semitransparent cathode of a top-emitting microcavity OLED. This means that less power can be used to emit the same level of luminance, or the same power can be used to emit a higher level of luminance. Thus, there exists a need for a top-emitting OLED with a highly transparent cathode.

Deposition methods for highly transparent cathodes (like those comprising indium tin oxide) in top-emitting OLEDs generally involve sputter deposition. Sputter deposition is a preferred method of depositing these cathodes because 1) the method allows optimization of the composition during film deposition for maximization of transparency and conductivity, and 2) the deposition method is compatible with mass manufacturing. However, sputtering can be damaging to the electron transport layer (ETL) within OLED devices. (See L. S. Liao, L. S. Hung, W. C. Chan, X. M. Ding, T. K. Sham, I. Bello, C. S. Lee, and S. T. Lee, "Ion-beam induced surface damages on tris-(8-hydroxyquinoline)aluminum", Appl. Phys. Lett. 75, 1619 (1999).) This damage reduces the intensity of the emission and may additionally render the pixels permanently inoperable. Thus, there exists a need to protect the ETL during manufacturing of an OLED.

SUMMARY OF THE INVENTION

It is therefore an object of the present invention to provide an OLED device capable of emitting light through the top surface with high efficiency. It is a further object of this invention to enable manufacturing of OLEDs with a transparent cathode. It is a further object of this invention to optimize viewing and image quality in a TE OLED. It is a further object of this invention to provide protection for the organic layers during high-speed deposition of transparent cathode for the OLED.

These objects are achieved by a method of making an OLED device capable of emitting light through the top electrode of such device comprising the steps of:

(a) providing a substrate and an anode over the substrate;

(b) providing an emissive layer disposed over the anode;

(c) providing first and second layers over the emissive layer with the first layer being in contact with the emissive layer and having a compound that includes an electron-injecting element, and the second layer having a reactive metal, and wherein such reactive metal reacts with the compound to release the electron-injecting element that dopes the interfacial region of the emissive layer to improve electron-injection and also reduces the reflectivity of the first and second layers is reduced; and (d) providing a transparent conducting non-metallic top electrode over the second layer.

This object is further achieved by a method of making an OLED device capable of emitting light through the top electrode of such device comprising the steps of:

(a) providing a substrate and an anode over the substrate;

(b) providing a hole-transport layer in contact with the anode;

(c) providing an emissive layer disposed over the hole-transport layer;

(d) providing an electron-transport layer in contact with the emissive layer;

(e) providing first and second layers over the electron-transport layer with the first layer being in contact with the electron-transport layer and having a compound that includes an electron-injecting element, and the second layer having a reactive metal, and wherein such reactive metal reacts with the compound to release the electron-injecting element that dopes the interfacial region of the electron-transport layer to improve electron-injection and also reduces the reflectivity of the first and second layers is reduced; and (f) providing a transparent conducting non-metallic top electrode over the second layer.

It is an advantage of the method of this invention that it enables manufacturing of top-emitting OLED devices in high volumes and at high speeds. It is a further advantage of this method that it reduces the microcavity effects and thereby produces an OLED with a wider range of viewing angles and with less color distortion.

Since device feature dimensions such as layer thicknesses are frequently in sub-micrometer ranges, the drawings are scaled for ease of visualization rather than dimensional accuracy.

DETAILED DESCRIPTION OF THE INVENTION

Throughout the ensuing description acronyms are used to designate the names of the different organic layers and operating features of organic light-emitting devices. For reference they are listed in Table 1

TABLE 1

| | |
|---|---|
| OLED | Organic light-emitting device |
| ITO | Indium tin oxide |
| HIL | Hole- injection Layer |
| HTL | Hole-transport layer |
| EML | Emissive layer |
| ETL | Electron-transport layer |
| NPB | 4,4'-Bis[N-(1-naphthyl)-N-phenylamino]biphenyl (NPB) |
| Alq | Tris(8-hydroxyquinoline) aluminum |
| C545T | 10-(2-benzothiazolyl)-2,3,6,7-tetrahydro-1,1,7,7-tetramethyl-1H,5H,11H-[1]benzopyrano[6,7,8-ij]quinolizin-11-one |
| DCJTB | 4-(dicyanomethylene)-2-t-butyl-6-(1,1,7,7-tetramethyljulolidyl-9-enyl)-4H-pyran |

The term "pixel" is employed in its art-recognized usage to designate an area of a display panel that can be stimulated to emit light independently of other areas. The term "OLED device" is used in its art-recognized meaning of a display device comprising organic light-emitting diodes as pixels and will also be referred to as an organic light-emitting device. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of producing light in the red, green, and blue regions of the visible spectrum and displaying images in any combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel and subpixel. The term "subpixel" is used in multicolor display panels and is employed to designate any portion of a pixel, which can be independently addressed to emit a specific color. For example, a blue subpixel is that portion of a pixel, which can be addressed to produce blue light. In a full-color display, a pixel generally includes three primary-color subpixels, namely blue, green, and red. The term "pitch" is used to designate the distance separating two pixels or subpixels in a display panel. Thus, a subpixel pitch means the separation between two subpixels.

Figure 1:
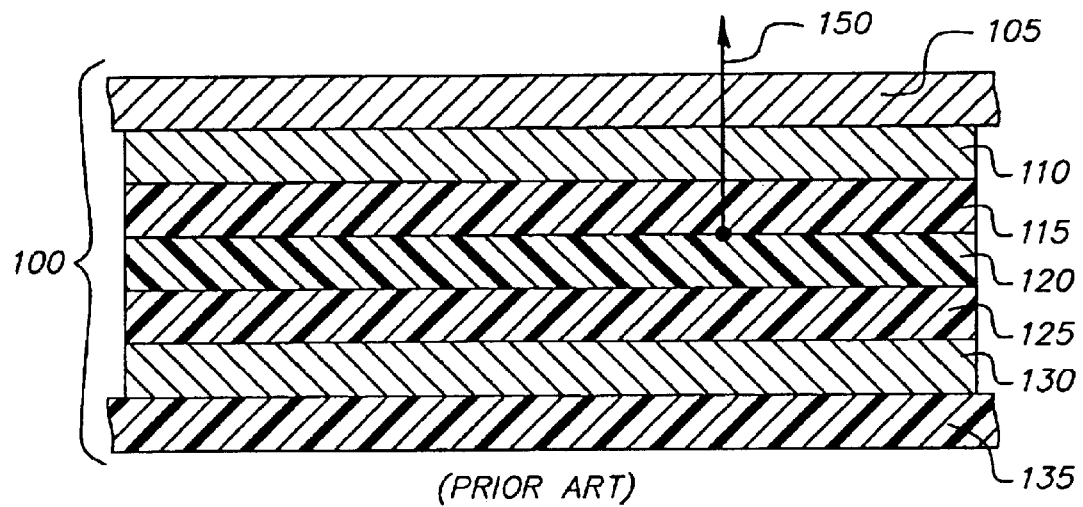
FIG. 1 shows a cross-sectional view of a conventional (prior art) top-emitting OLED device.

In order to sufficiently explain the present invention, the following prior art structure of an OLED device capable of emitting light through the top electrode is described. FIG. 1 shows a cross-section of a prior art top-emitting OLED device 100, including a partially reflective cathode 105, an electron-transporting layer 110, an emissive layer 115, a hole-transporting layer 120, a hole-injecting layer 125, an anode 130, and a substrate 135.

Substrate 135 can be an organic solid, an inorganic solid, or a combination of organic and inorganic solids that provides a surface over which the layers comprising the OLEDs are deposited. Substrate 135 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. In other examples, substrate 135 is a material selected from a group of materials including, but not limited to: Si, Ge, GaAs, GaP, GaN, GaSb, InAs, InP, InSb, and $Al_x Ga_{1-x} As$, where x is from 0 to 1. Substrate 135 can be a homogeneous mixture of materials, a composite of materials, or multiple layers of materials. Substrate 135 can be an OLED substrate, that is a substrate commonly used for preparing OLED devices, e.g. active-matrix low-temperature polysilicon TFT substrate. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices. Additionally, substrate 135 is either bare or covered with a layer of dielectric material such as Si oxides or Si nitrides.

Anode 130 is formed over substrate 135. Anode 130 is connected to an electrical power source and injects holes into emitting layer 115. For applications such as this where EL emission is viewed through the top electrode, the transmissive characteristics of the anode material are sometimes immaterial and any conductive material can be used, transparent, opaque or reflective. Example conductors for this application include, but are not limited to, indium-tin oxide and tin oxide, but other metal oxides can work including, but not limited to, aluminum- or indium-doped zinc oxide, magnesium-indium oxide, nickel-tungsten oxide, gold, iridium, molybdenum, palladium, and platinum. In addition to these materials, metal nitrides such as gallium nitride, metal selenides such as zinc selenide, and metal sulfides such as zinc sulfide, can be used as an anode material. In another example, anode 130 is any of the following materials, including but not limited to: rare-earth metal silicides, yttrium silicides, chromium borides, and lanthanum borides. The preferred anode materials, transmissive or otherwise, have a work function of 4.0 eV or greater. Desired anode materials can be deposited by any suitable means such as evaporation, sputtering, hot substrate deposition on Si, laser ablation, metal deposition followed by thermal annealing, chemical vapor deposition, or electrochemical means. Anode materials can be patterned using well-known photolithographic processes. Although the transmissive characteristics of anode 130 do not directly affect the emission of light, they can affect it indirectly. In one example, anode 130 or substrate 135 or both are reflective in order to increase the total amount of light emitted by OLED device 100 by reflecting light emitted from emissive layer 115. In another example, anode 130 or substrate 135 or both are light absorbing to limit the microcavity effect and to increase the overall contrast of OLED device 100. In another example, both substrate 135 and anode 130 are transparent to form a fully transparent OLED device capable of emitting light through both the top and bottom electrodes.

While not always necessary, it is often useful that a hole-injecting layer 125 be formed over anode 130 in an organic light-emitting display. The hole-injecting material can serve to improve the film formation property of subsequent organic layers and to facilitate injection of holes into the hole-transporting layer resulting in increased luminance efficiency and operational stability of devices. Suitable materials for use in the hole-injecting layer 125 include, but are not limited to, porphyrinic compounds as described in U.S. Pat. No. 4,720,432, and plasma-deposited fluorocarbon polymers as described in U.S. Pat. No. 6,208,075. Other materials can also be used as hole injectors. These include oxides of Mo, V or Ru. A layer of these materials each about 30 nm thick on 120 nm thick ITO have been found useful as a hole injector to TPD, an hole-transport layer ("Metal oxides as a hole-injecting layer for an organic electroluminescent device", S. Tokito, K. Noda and Y. Taga, J. Phys. D; Appl. Phys. 29, 2750 (1996)). In accordance with the present invention ultrathin layers of $CF_x$ or $MoO_x$ (x<3.0) were found to provide efficient hole injection from the metal anode 130 to the hole-transport layer 120 of FIG. 1, FIG. 2, or FIG. 3. $MoO_x$ layer is prepared by vacuum evaporation of $MoO_3$ and the deposited film may be non-stoichiometric. Other hole injectors for metal anodes may include ITO, IZO, $Pr_2O_3$, $TeO_2$, CuPc, or $SiO_2$.

Alternative hole-injecting materials reportedly useful in organic EL devices are described in EP 0 891 121 A1 and EP 1,029,909 A1. In one example, when gold is used for anode 130, very thin nickel or nickel oxide are particularly good for hole-injecting layer 125, since they both function to improve conductivity and the nickel or nickel oxide helps the gold to adhere. Furthermore, the work function of hole-injecting layer 125 should be chosen to match the highest occupied molecular orbital (HOMO) of hole-transporting layer 120.

While not always necessary, it is often useful that a hole-transporting layer 120 be formed over hole-injecting layer 125, or over anode 130 if no hole-injecting layer is used. Desired hole-transporting materials can be deposited by any suitable means such as evaporation, sputtering, chemical vapor deposition, electrochemical means, thermal transfer, or laser thermal transfer from a donor material. Hole-transporting materials useful in hole-transporting layer 120 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (A).

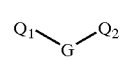

A wherein $Q_1$ and $Q_2$ are independently selected aromatic tertiary amine moieties and G is a linking group such as an arylene, cycloalkylene, or alkylene group of a carbon-to-carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

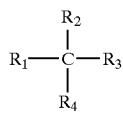

where $R_1$ and $R_2$ each independently represent a hydrogen atom, an aryl group, or an alkyl group or $R_1$ and $R_2$ together represent the atoms completing a cycloalkyl group; and $R_3$ and $R_4$ each independently represent an aryl group, which is in turn substituted with a diaryl substituted amino group, as indicated by structural formula (C):

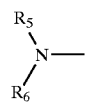

wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by formula (C), linked through an arylene group. Useful tetraaryldiamines include those represented by formula (D).

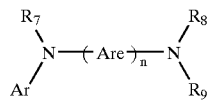

wherein each Are is an independently selected arylene group, such as a phenylene or anthracene moiety, n is an integer of from 1 to 4, and Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl (NPB)
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

An emissive layer 115 producing light in response to hole-electron recombination is formed over anode 130 and over any other layers formed, such as hole-transporting layer 120. Emissive layer 115 emits light in all directions within OLED device 100, but OLED device 100 is designed to maximize viewing quality when images are viewed through partially reflective cathode 105. Desired organic light-emitting materials can be deposited by any suitable means such as evaporation, sputtering, chemical vapor deposition, spin coating from a solution, electrochemical means, or radiation transfer from a donor material. Useful organic light-emitting materials are well known. As more fully described in U.S. Pat. Nos. 4,769,292 and 5,935,721, the light-emitting layer of the organic EL element comprises a luminescent or fluorescent material where electroluminescence is produced as a result of electron-hole pair recombination in this region. The light-emitting layer 115 can include a single material, but more commonly includes a host material doped with a guest compound or dopant source where light emission comes primarily from the dopant and can be of any color. The host materials in the light-emitting layer 115 can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital (HOMO) and the lowest unoccupied molecular orbital (LUMO) of the molecule. For efficient energy transfer from the host material to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721, and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

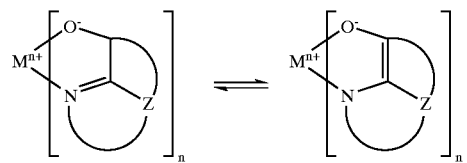

E wherein
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo{f}-8-quinolinolato]zinc (II)
CO-4: Bis(2-methyl-8-quinolinolato)aluminum(III)-1-oxo-bis(2-methyl-8-quinolinolato) aluminum(III)
CO-5: Indium trisoxine [alias, tris(8-quinolinolato) indium]
CO-6: Aluminum tris(5-methyloxine) [alias, tris(5-methyl-8-quinolinolato) aluminum(III)]
CO-7: Lithium oxine [alias, (8-quinolinolato)lithium(I)]

Derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

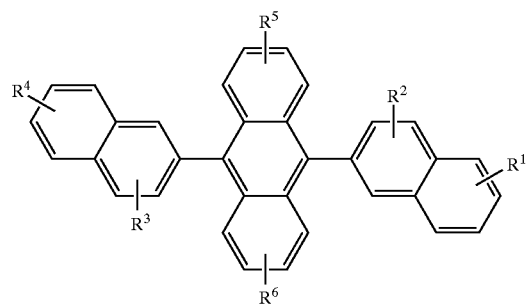

F wherein: $R^1$, $R^2$, $R^3$, $R^4$, $R^5$, and $R^6$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Benzazole derivatives (Formula G) constitute another class of useful host materials capable of supporting electroluminescence, and are particularly suitable for light emission of wavelengths longer than 400 nm, e.g., blue, green, yellow, orange or red.

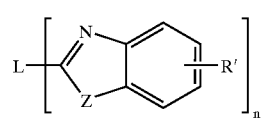

G

Where:
n is an integer of 3 to 8;
Z is O, NR or S; and
R' is hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring;
L is a linkage unit consisting of alkyl, aryl, substituted alkyl, or substituted aryl, which conjugately or unconjugately connects the multiple benzazoles together.

An example of a useful benzazole is 2,2',2''-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

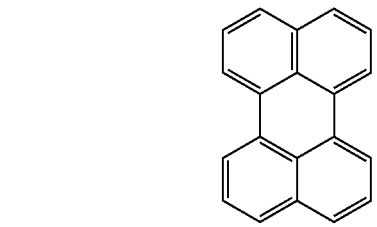

L1

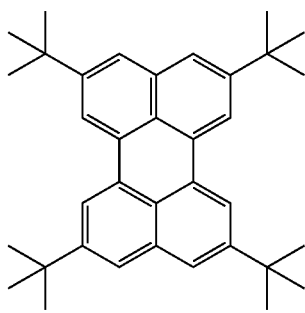

L2

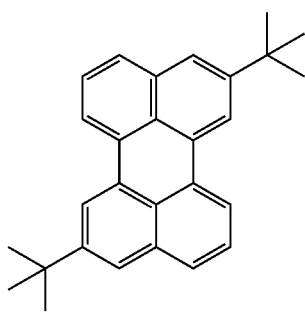

L3

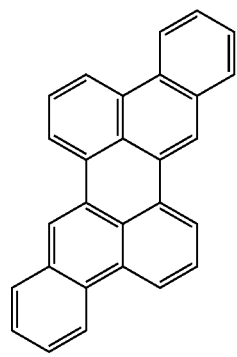

L4

-continued

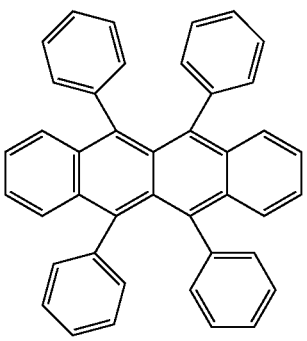

L5

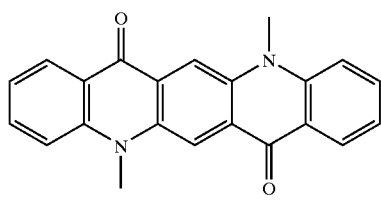

L6

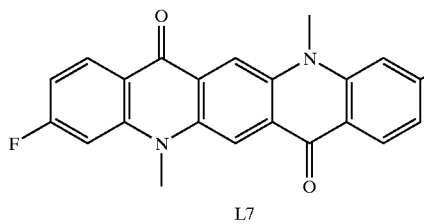

L7

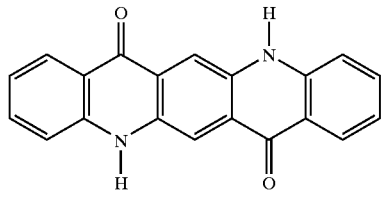

L8

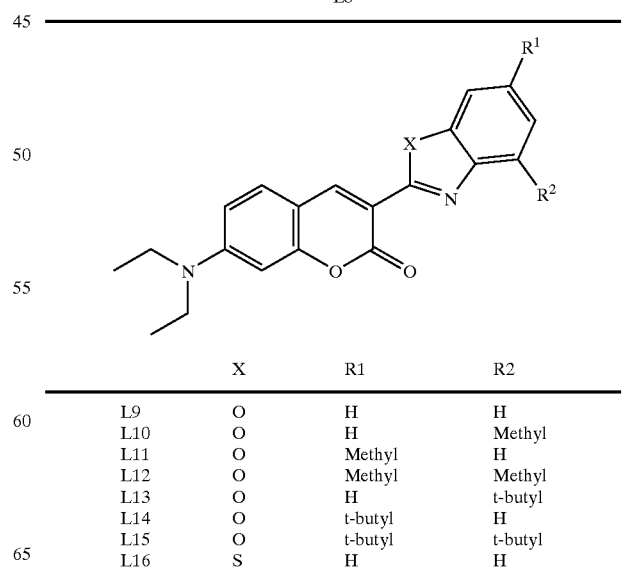

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |

-continued
| | | | |
|---|---|---|---|
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
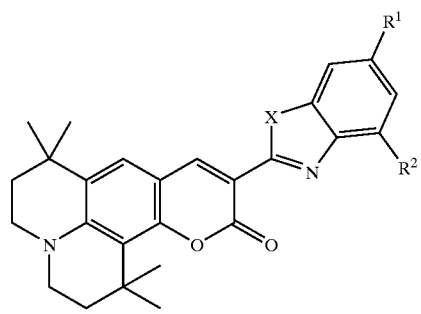
| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |
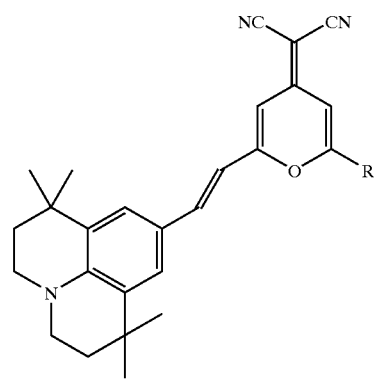
| | R |
|---|---|
| L37 | phenyl |
| L38 | methyl |
| L39 | t-butyl |
| L40 | mesityl |
-continued
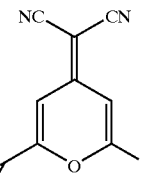
| | R |
|---|---|
| L41 | phenyl |
| L42 | methyl |
| L43 | t-butyl |
| L44 | mesityl |
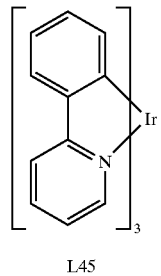
L45
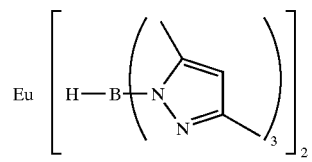
L46
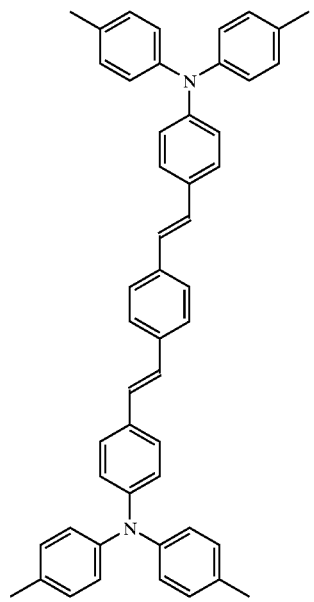
L47

-continued

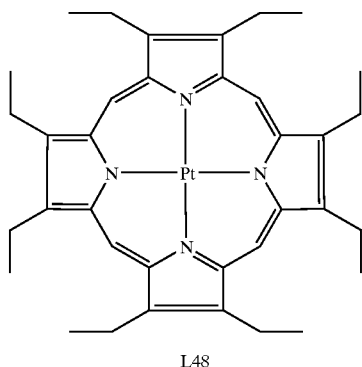

L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al in commonly assigned U.S. Pat. No. 6,194,119 B1 and references therein.

Although not shown, light-emitting layer 115 can additionally comprise two or more emissive layers, if such is desired for proper emissive properties of the resulting OLED device.

Electron-transporting layer 110 is formed over emissive layer 115. Desired electron-transporting materials can be deposited by any suitable means such as evaporation, sputtering, chemical vapor deposition, electrochemical means, thermal transfer, or laser thermal transfer from a donor material. Preferred electron-transporting materials for use in electron-transporting layer 110 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

Partially reflective cathode 105 is a semi-transparent cathode within the top-emitting OLED device 100. Partially reflective cathode generally exhibits at least 30% transmittance, with a resistivity of less than $1 \times 10^{-4}$ ohm-cm. The partially reflective cathode 105 (FIG. 1) is connected to an electrical power source (not shown) and injects electrons into emissive layer 115. The partially reflective cathode 105 reflects a portion of the light from emissive layer 115 back towards anode 130, contributing to the undesirable microcavity effect within OLED device 100. In one example, partially reflective cathode 105 includes a semi-transparent MgAg layer of about 8- to 10 nm thick.

While the cathode 105 is shown here as only a single layer, it is understood that multiple adjacent layers of thin metals, metal oxides, and other materials can be used to achieve the desired properties of the cathode 105.

In operation, an electric power source (not shown) is connected to OLED device 100. The positive terminal of the electric power source is connected to anode 130, and partially reflective cathode 105 is connected to the negative terminal of the electric power source. Holes are injected from anode 130 into emissive layer 115, and electrons are injected from partially reflective cathode 105 into emissive layer 115. The injected holes (positive charge) and injected electrons (negative charge) recombine in emissive layer 115 to produce light 150 (electroluminescence). Emissive layer 115 emits light in all directions, towards both anode 130 and partially reflective cathode 105. A portion of light that is incident upon partially reflective cathode 105 passes through it. The remaining light is reflected at the cathode 105 and directed to the anode 130. If anode 130 is reflective, the light that is reflected from the cathode 105 or emitted from the emissive layer 115 is directed towards anode 130 and can be reflected back towards partially reflective cathode 105. Some light exits the OLED device 100 through partially reflective cathode 105 and some light is reflected back and forth between partially reflective cathode 105 and reflective anode 130. A significant amount of generated light passes through partially reflective cathode 105. However, some of the light is reflected back towards the anode 130 by partially reflective cathode 105 and can be lost. In addition to wasting energy, this micro-cavity effect causes viewing quality problems that result in unintended color distortions of light that are most significant when OLED device 100 is viewed at an oblique angle.

Figure 2:
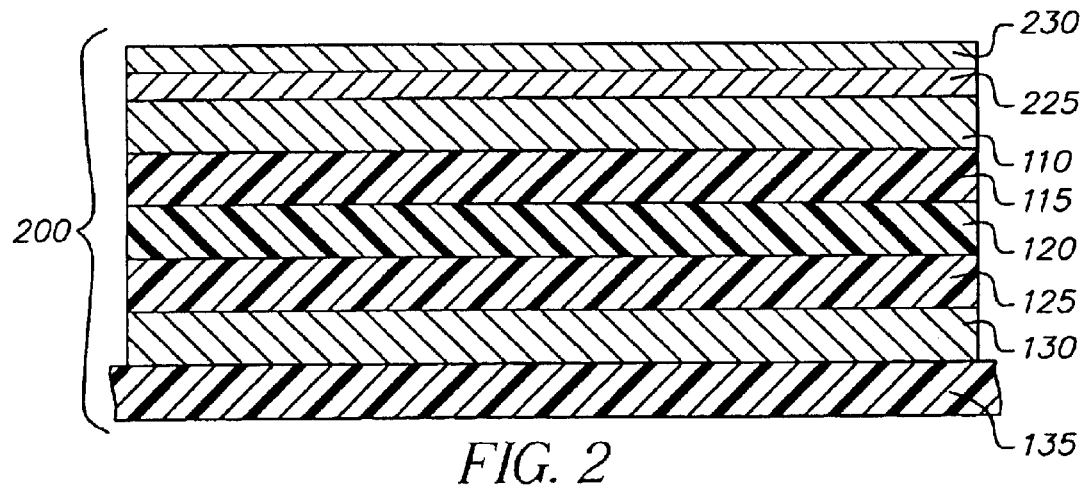
FIG. 2 shows a cross-sectional view of a step in making a top-emitting OLED device according to the present invention.

The present invention is now described, wherein the microcavity effects are largely eliminated. FIG. 2 shows a cross-sectional view of a step in making a top-emitting OLED device that will include a transparent non-metallic top electrode according to the present invention. Partial OLED device 200 at this step of the manufacturing process includes the elements of: substrate 135, anode 130, hole-injecting layer 125, hole-transporting layer 120, emissive layer 115, electron-transporting layer 110, and one or more layers over electron-transporting layer 110 (if present) and over emissive layer 115. In a preferred embodiment, this includes a first layer 225, and a second layer 230. Conventional top-emitting OLED manufacturing steps are used to deposit the initial layers of partial OLED device 200 up to electron-transporting layer 110, and including emissive layer 115, hole-transporting layer 120, hole-injecting layer 125, anode 130 over the substrate 135 are as described in FIG. 1 with respect to OLED device 100.

In this embodiment, first layer 225 is deposited to be in contact with electron-transporting layer 110, preferably by thermal evaporation. First layer 225 has two main functions: 1) to provide a protective barrier over electron-transporting layer 110 and emissive layer 115 during subsequent manufacturing steps; and 2) to provide, in reaction with second layer 230, an electron-injecting element that dopes the interfacial region of the electron-transporting layer 110 to improve electron-injection and also to reduce the reflectivity of the first and second layers 225 and 230. This doping confers additional electron-injecting properties to electron-transporting layer 110.

First layer 225 includes a compound that includes an electron-injecting element, such as an alkali metal (group 1A of the periodic table) or an alkaline earth metal (group 2A of the periodic table). The compound can include halide, oxide, sulfide, nitrate, iodate, oxalate, or acetate salts of group 1A or group 2A metals, or any combinations thereof. Particularly preferred are fluoride salts of group 1A metals excluding lithium, e.g. NaF, KF, RbF, and CsF. The thickness of first layer 225 is preferably in the range of 1 to 6 nm. In one example, first layer 225 is a 3 nm layer of RbF, thermally evaporated onto an electron-transporting layer 110 that is made of Alq. Preferably, first layer 225 is as close to transparent as is possible so as to minimize absorption in this layer.

The first layer 225 also acts as a buffer layer, as alkali metal fluorides are robust and are believed resistant to Ar plasma, which is usually used in the sputter gas. The buffer layer protects the underlying layers during sputtering deposition of subsequent layers. The buffer layer also functions as an electron injecting dopant source.

Second layer 230 is deposited onto first layer 225. Second layer 230 includes a reactive metal, the purpose of which is to react with the compound in first layer 225 to release the electron-injecting element. The reactive metal can include Al, Be, Mg, Ca, Sr, Ba, Sc, Y, La, Ac, Th, Ti, Zr, Hf, or La, or alloys or mixtures thereof The reactive metal is preferably Al or Mg or alloys or mixtures thereof. Second layer 230 preferably has a thickness of 1 to 6 nm. The thicknesses of first layer 225 and second layer 230 are selected to ensure substantially complete reaction between the reactive metal and the compound. By this it is meant that the amount of material selected for second layer 230 is chosen such that all or nearly all of the material will be reacted with first layer 225. This has the beneficial effect of minimizing the reflectivity of second layer 230. Preferably, second layer 230 is as close to transparent as is possible, such that if any of the material is left unreacted, the absorption or reflection will be negligible by the remaining materials.

It is possible that manufacturing errors will introduce some variation in the amount of second layer 230 applied. In the example described above, if too much magnesium is added in second layer 230, the excess magnesium reflects some light. If too little magnesium is added in second layer 230, the unreacted portion of rubidium fluoride on the electron-transporting layer 110, will negatively impact the efficiency of electron transport. It is therefore important to take such manufacturing variations into consideration when selecting the thicknesses of first layer 225 and second layer 230.

Another important quality of the material used in second layer 230 is that it can be applied inexpensively. In one example, second layer 230 is applied by a sputtering process by which the adherence of the second layer 230 to the first layer 225 is improved. Another important quality of the material used in second layer 230 is that it can be sputtered at high rate using low sputtering power, causing less damage to electron-transporting layer 110 and emissive layer 115. In this example, second layer 230 is a thin layer of Mg.

Second layer 230 is required to begin a chemical reaction between first layer 225 and electron-transporting layer 110. The reactive metal selected for second layer 230 must react with first layer 225 to release electron injecting dopant, thereby reacting with the electron-transporting layer 110. In one specific example, first layer 225 made of RbF is reacted with second layer 230 made of Mg on an Alq electron-transporting layer 110. In this example, magnesium in second layer 230 reacts with the RbF in first layer 225 to form $MgF_2$. This leaves rubidium free to dope the Alq in electron-transporting layer 110 at the interface region, forming an enhanced electron injection interface with $Rb^+$ and $Alq^-$ in the top surface region of the electron-transporting layer 110. The heavily doped interface provides a surface region that permits enhanced electron injection. When a fluoride salt such as RbF is used in first layer 225, the standard Gibbs free energy of formation of fluorides of the reactive metal selected for second layer 230 should be about −180 Kcal/mole of $F_2$ or less. The first and second layers 225 and 230 are selected such that the products of reaction are transparent so that the emitted light emerges through top with no preferential attenuation in the visible wavelength.

It is a preferred embodiment to have the compound in first layer 225 and the reactive metal in second layer 230, which allows one to use the best deposition method for each layer, e.g. evaporation for the first layer 225 and sputtering for second layer 230. However, it is also possible to deposit the compound and the reactive metal in a single layer by e.g. co-evaporation from two different boats. During or after co-deposition, the reactive metal and the compound can react as described above.

Figure 3:
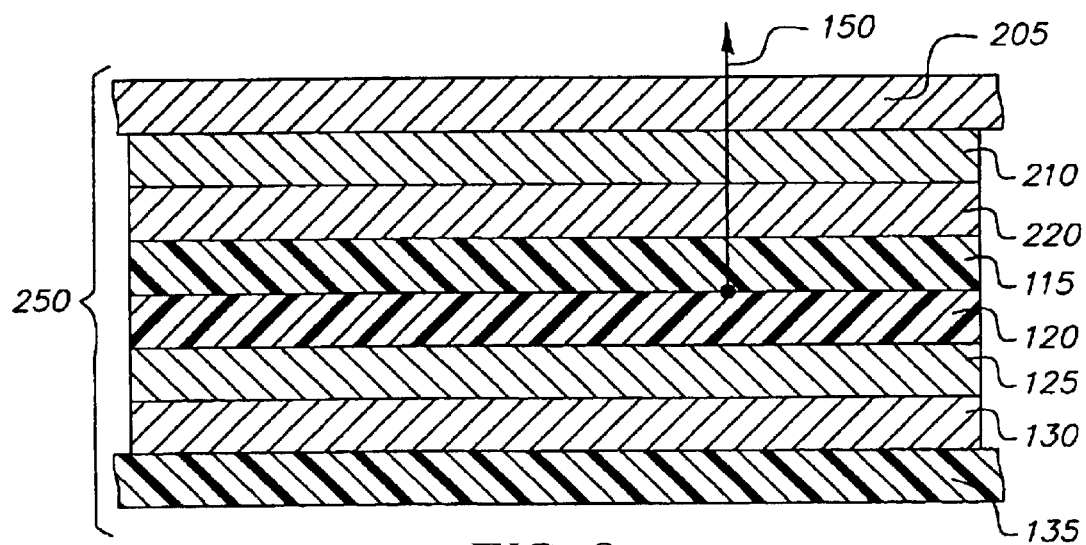
FIG. 3 shows a cross-sectional view of the completed structure of a top-emitting OLED device prepared according to the present invention.

FIG. 3 shows OLED device 250 after the manufacturing process is completed, including the elements of: a transparent conducting non-metallic top electrode 205 deposited over enhanced electron-injecting layer 210 (formed by chemical reactions described above between first layer 225 and second layer 230), an enhanced electron-transporting layer 220, emissive layer 115, hole-transporting layer 120, hole-injecting layer 125, anode 130, and substrate 135. At least the top portion of electron-transporting layer 110 reacted with first and second layers 225 and 230 (FIG. 2) to form enhanced electron-transporting layer 220 (FIG. 3), which includes additional metal from first layer 225 in at least the top portion of enhanced electron-transporting layer 220.

Transparent conducting non-metallic top electrode 205 is distinct from partially reflective cathode 105 described above in that its transmissivity and resistivity are higher. Preferably, transparent conducting non-metallic top electrode 205 has at least 80% transmittance, with resistivity less than $10^{-3}$ ohm-cm. Transparent conducting non-metallic top electrode 205 should be transparent to wavelengths in the visible spectrum. The thickness of transparent conducting non-metallic top electrode 205 is determined from optical stack calculation as well as by evaluating the trade-offs between conductivity, transparency, and the amount of stress that the OLED device can endure (e.g., if transparent conducting non-metallic top electrode 205 is too thin, there is insufficient conductivity; if transparent conducting non-metallic top electrode 205 is too thick, there is too much stress on emissive layer 115 and too little transparency through transparent conducting non-metallic top electrode 205).

In one example, transparent conducting non-metallic top electrode 205 is comprised of indium tin oxide (ITO). ITO is usually sputtered either from ITO target or from an In:Sn alloy target or from component metal (In and Sn) targets in $Ar+O_2$ atmosphere. Balance of sputtering power and concentration of $O_2$ is needed to make the film highly transparent and conducting and minimizing sputter damage to the organic layers. In other examples, transparent conducting non-metallic top electrode 205 is comprised of any of the following materials, including but not limited to: indium zinc oxide (IZO), tin oxide (TO), antimony-doped tin oxide (ATO), fluorine-doped tin oxide (FTO), indium oxide (IO), zinc oxide (ZO), cadmium stannate (CTO), cadmium oxide, phosphorus-doped tin oxide, and aluminum-doped zinc oxide.

The transparent conducting non-metallic top electrode 205 nearly eliminates microcavity effects within OLED device 250.

By reducing microcavity effects, OLED device 250 satisfies a number of the objects of this invention. First, the object of this invention to optimize viewing and image quality in a top-emitting OLED is satisfied because transparent conducting non-metallic top electrode 205 has low reflectivity, significantly reducing the microcavity effect and resultant color distortion. Second, the object of this invention to enable a high throughput manufacturing process of OLEDs with a transparent cathode is achieved by the use of sputtering. Third, the object of the present invention to extend the useful lifetime of an OLED device is satisfied by allowing OLED device 250 to be driven with low current density.

Figure 4:
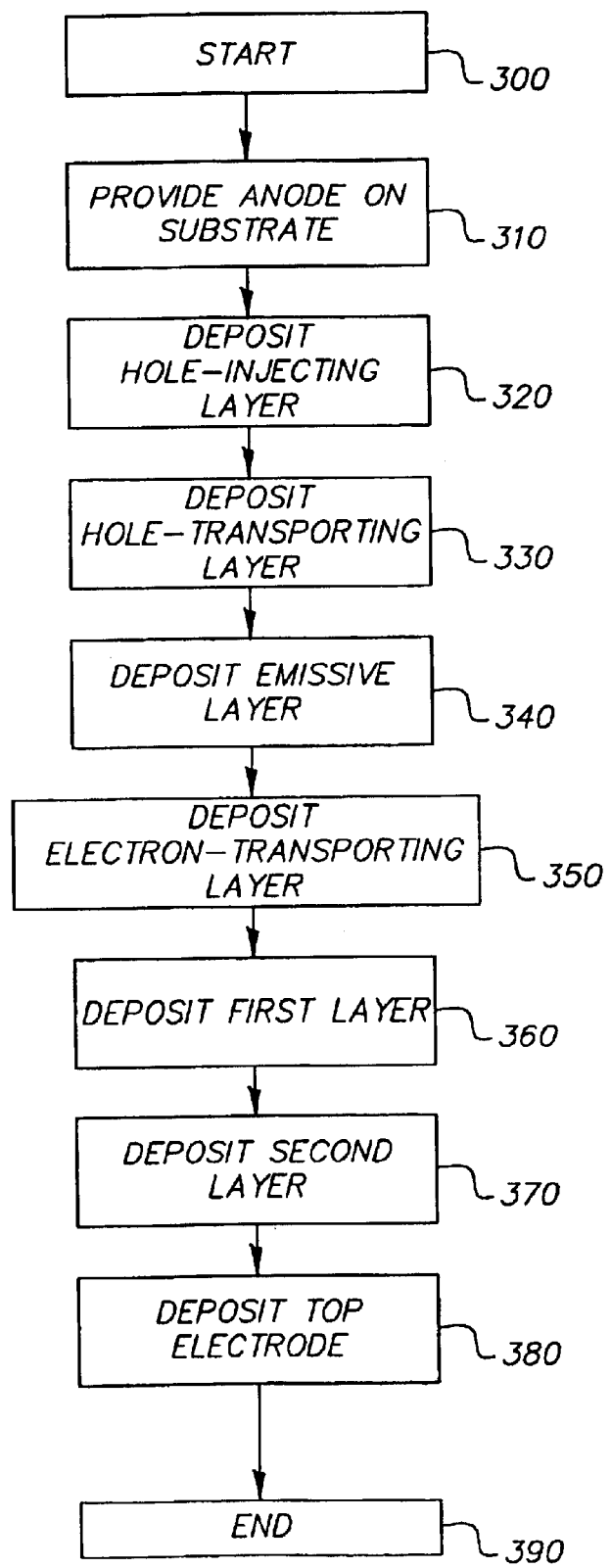
FIG. 4 is a block diagram showing the steps in one embodiment of the present invention.

Turning now to FIG. 4, there is shown a block diagram showing the steps involved in practicing one embodiment of this invention. At the start (Step 300), an OLED substrate 135 is provided with an anode 130 (Step 310). Anode 130 can be deposited by well-known methods, and can be part of a passive matrix or an active matrix system. A hole-injecting layer 125 and a hole-transporting layer 120 can then optionally be deposited subsequently (Steps 320 and 330, respectively). An emissive layer 115 is then deposited (Step 340), followed by an electron-transporting layer 110 (Step 350). A predetermined thickness of first layer 225 as described herein is then deposited over electron-transporting layer 110 (Step 360), preferably by thermal evaporation. A predetermined thickness of second layer 230 is then deposited over first layer 225 (Step 370), preferably by sputtering, which produces the reactions described herein. A transparent conducting non-metallic top electrode 105 is then deposited over second layer 230 (Step 380), preferably by sputtering. The process then ends (Step 390).

The invention and its advantages can be better appreciated by the following comparative examples.

General

Prior art bottom-emitting devices were fabricated using glass substrates having a commercial grade 42-nm thick, 70-ohm/sq patterned indium tin oxide (ITO) layer. After routine cleaning, a 1-nm $CF_x$ hole-injecting layer was deposited on the ITO surface by decomposing $CHF_3$ gas in RF plasma.

The substrates for the devices of the present invention were glass plates upon which was deposited a 100 nm layer of Ag by sputtering in an Ar atmosphere. The metallized glass substrates were then coated with a 1 nm $CF_x$ hole-injecting layer.

After formation of the anode and hole-injecting layers, the substrates were transferred to a vacuum coater operating at $\sim 1 \times 10^{-6}$ Torr. A hole-transporting layer, an emissive layer, and an electron-transporting layer were deposited in sequence. The hole-transporting layer comprised Alq deposited to a thickness of 20 nm or 30 nm.

The samples were then transferred to a multifunction coater where the remaining layers were deposited in proper sequence to generate various device configurations. The cathode layer was deposited through a square mask, which defined an active area of 0.1 cm$^2$ for the device. Prior art bottom-emitting devices have a bi-layer cathode of 0.5 nm LiF/1.0 nm Al, deposited by evaporation. Devices of the present invention have a 2.5 nm or 3 nm RbF layer vapor deposited on the electron-transporting layer, a layer of Mg 3 nm to 5 nm thick, that was sputtered on the RbF layer at a power density of 5 watt/cm$^2$ and at a rate of 1.0 nm/s, and finally a layer of ITO, 60 nm thick, deposited on the Mg layer by sputtering in an Ar atmosphere having 0.5% $O_2$ and using a power density of 8 watt/cm$^2$. All devices—prior art or present invention—were hermetically encapsulated in a glove box filled with dry nitrogen.

The luminance of the devices was determined using a Photo Research PR650 spectroradiometer as a function of current. The drive voltage and luminance given here were obtained when a current of 20 mA/cm$^2$ was passed through the device. The voltage drop caused by series resistance of the ITO or the metal anode layer was subtracted from the measured drive voltage.

EXAMPLE 1

A prior-art bottom-emitting device, device "1A", was made as described above with 1% C545T as the emissive layer dopant. The device has the following layer structure:

Glass(1.1 mm)/ITO(42 nm)/$CF_x$(1 nm)/NPB(50 nm)/1% C545T in Alq (30 nm)/Alq(20 nm)/LiF(0.5 nm)/Al(100 nm)

EXAMPLE 2

A top-emitting device of the present invention, device "2B" was made with the same hole-transporting, emissive, and electron-transporting layers as the device "1A". The device "2B" has the following layer structure:

Glass(1.1 mm)/Ag(100 nm)/$CF_x$(1 nm)/NPB(50 nm)/1% C545T in Alq (30 nm)/Alq(20 nm)/RbF(3 nm)/Mg(5 nm)/ITO(60 nm)

EXAMPLE 3

A prior-art bottom-emitting device, device "3A", was made as described above with 1% DCJTB as the emissive layer dopant. The device has the following layer structure:

Glass(1.1 mm)/ITO(42 nm)/$CF_x$(1 nm)/NPB(60 nm)/1% DCJTB in Alq (30 nm)/Alq(30 nm)/LiF(0.5 nm)/ Al(70 nm)

EXAMPLE 4

A top-emitting device of the present invention, device "4B" was made with the same hole-transporting, emissive, and electron-transporting layers as the device "3A". The device "4B" has the following layer structure:

Glass(1.1 mm)/Ag(100 nm)/$CF_x$(1 nm)/NPB(60 nm)/1% DCJTB in Alq (30 nm)/Alq(30 nm)/RbF(2.5 nm)/Mg(3 nm)/ITO(60 nm)

The results are shown in Table 2.

TABLE 2

| Example # | Device | Drive current (mA/cm$^2$) | Drive voltage (V) | Luminance efficiency (cd/A) | Peak emission wavelength (nm) |
|---|---|---|---|---|---|
| 1 | 1A | 20 | 5.2 | 6.3 | 520 |
| 2 | 2B | 20 | 7.4 | 11.8 | 528 |
| 3 | 3A | 20 | 6.7 | 3.5 | 616 |
| 4 | 4B | 20 | 9.9 | 7.5 | 608 |

The angular dependence of emission of device 4B was measured. Relative to on-axis emission, the luminance measured at 45 degrees off-axis was reduced by 30% and the peak emission wavelength is shifted-toward shorter wavelength side by 8 nm. This small shift in wavelength in the present invention may reflect the contribution of the reflective anode. When compared with a reported microcavity device that exhibited a peak shift of 40 nm (N. Takada, T. Tsutsui, and S. Saito, *Appl. Phys. Lett.* 63 (15) 2032 (1993) "Control of emission characteristics in organic thin film electroluminescent diodes using an optical microcavity structure"), the peak shift of the device 4B of the present invention at 45 degrees is greatly mimimized.

Examples 1 through 4 show that efficiency of top-emitting non-microcavity devices having the transparent non-metallic cathode is significantly higher than those of conventional non-microcavity devices with identical organic layers. However, the devices of the present invention have somewhat higher voltages compared to those of the conventional non-microcavity devices. This may be due to presence of insulating $MgF_2$, a reaction product between RbF and Mg. It is believed that by selecting the thickness of RbF or such compound containing an electron-injecting dopant and Mg or other reactive metal the build up of insulating reaction product in the interface between the electron-transporting layer and the indium tin oxide layer can be minimized, resulting in better electron injection and lower drive voltage.

The invention has been described in detail with particular reference to certain preferred embodiments thereof, but it will be understood that variations and modifications can be effected within the spirit and scope of the invention.

PARTS LIST

100 OLED device
105 cathode
110 electron-transporting layer
115 emissive layer
120 hole-transporting layer
125 hole-injecting layer
130 anode
135 substrate
150 light
200 partial OLED device
205 transparent conducting non-metallic top electrode
210 electron-injecting layer
220 electron-transporting layer
225 first layer
230 second layer
250 OLED device
300 block
310 block
320 block
330 block
340 block
350 block
360 block
370 block
380 block
390 block

What is claimed is:

1. A method of making an OLED device capable of emitting light through a top electrode of such device comprising the steps of:
   (a) providing a substrate and an anode over the substrate;
   (b) providing an emissive layer disposed over the anode;
   (c) providing first and second layers over the emissive layer with the first layer being in contact with the emissive layer and having a compound that includes an electron-injecting element, and the second layer being in contact with the first layer, and having a reactive metal, and wherein such reactive metal reacts with the compound to release the electron-injecting element that dopes an interfacial region of the emissive layer to improve electron-injection and also reduces the reflectivity of the first and second layers; and
   (d) providing a transparent conducting non-metallic top electrode over the second layer.

2. The method of claim 1 wherein the compound includes halides, oxides, sulfides, nitrates, iodates, oxalates, acetates of alkali and alkaline earth metals.

3. The method of claim 2 wherein the compound includes fluorides of group 1A of the periodic table metals except lithium.

4. The method of claim 1 wherein the reactive metal includes Ca, Ba, Sr or Y or alloys or mixtures thereof.

5. The method of claim 1 wherein the reactive metal includes Mg or Al or alloys or mixtures thereof.

6. The method of claim 1 wherein the transparent conducting non-metallic top electrode is formed by sputtering.

7. The method of claim 6 wherein the transparent conducting non-metallic top electrode includes indium tin oxide, indium zinc oxide, tin oxide, antimony-doped tin oxide, indium oxide, fluorine-doped tin oxide, or zinc oxide, or mixtures thereof.

8. The method of claim 1 wherein the thicknesses of the first and second layers are selected to ensure complete reaction between the reactive metal and the compound.

9. The method of claim 8 wherein the compound is NaF, KF, RbF, or CsF, and the thickness of the first layer is in a range of 1 to 6 nm.

10. The method of claim 8 wherein the thickness of the second layer is in the range of 1 to 6 nm, and the reactive metal includes Mg or Al or alloys or mixtures thereof.

11. The method of claim 1 wherein the emissive layer includes Alq.

12. The method of claim 11 wherein the emissive layer includes red, green and blue dopants.

13. A method of making an OLED device capable of emitting light through a top electrode of such device comprising the steps of:
   (a) providing a substrate and an anode over the substrate;
   (b) providing a hole-injection layer in contact with the anode;
   (c) providing a hole-transport layer in contact with the hole-injection layer;
   (d) providing an emissive layer disposed over the hole-transport layer;
   (e) providing an electron-transport layer in contact with the emissive layer;
   (f) providing first and second layers over the electron-transport layer with the first layer being in contact with the electron-transport layer and having a compound that includes an electron-injecting element, and the second layer being in contact with the first layer, and having a reactive metal, and wherein such reactive metal reacts with the compound to release the electron-injecting element that dopes an interfacial region of the electron-transport layer to improve electron-injection and also reduces the reflectivity of the first and second layers; and
   (g) providing a transparent conducting non-metallic top electrode over the second layer.

14. The method of claim 13 wherein the hole injection layer include fluorocarbon polymers, ITO, IZO, $Pr_2O_3$, $TeO_2$, CuPC, $SiO_2$, suboxides Mo, V or Ru.

15. The method of claim 13 wherein the hole injection includes CFx (x~2.0) or MoOx (x~3.0).

16. The method of claim 13 wherein the compound includes halides, oxides, sulfides, nitrates, iodates, oxalates, acetates of alkali and alkaline earth metals.

17. The method of claim 16 wherein the compound includes fluorides of group 1A of the periodic table metals except lithium.

18. The method of claim 13 wherein the reactive metal includes Ca, Ba, Sr or Y or alloys or mixtures thereof.

19. The method of claim 13 wherein the reactive metal includes Mg or Al or alloys or mixtures thereof.

20. The method of claim 13 wherein the thicknesses of the first and second layers are selected to ensure complete reaction between the reactive metal and the compound.

21. The method of claim 20 wherein the compound is NaF, KF, RbF, or CsF, and the thickness of the first layer is in a range of 1 to 6 nm.

22. The method of claim 20 wherein the thickness of the second layer is in the range of 1 to 6 nm, and the reactive metal includes Mg or Al or alloys or mixtures thereof.

23. The method of claim 13 wherein the transparent conducting non-metallic top electrode is formed by sputtering.

24. The method of claim 13 wherein the transparent conducting non-metallic top electrode includes indium tin oxide, indium zinc oxide, tin oxide, antimony-doped tin oxide, indium oxide, fluorine-doped tin oxide, or zinc oxide, or mixtures thereof.

25. The method of claim 13 wherein the first layer is in contact with the electron-transport layer and the second layer is on the first layer.

26. The method of claim 13 wherein the emissive layer includes Alq.

27. The method of claim 26 wherein the emissive layer includes red, green.

28. The method of claim 13 wherein the hole-transport layer includes NPB.

* * * * *